United States Patent [19]

Hutchinson et al.

[11] Patent Number: 4,548,699
[45] Date of Patent: Oct. 22, 1985

[54] TRANSFER PLATE ROTATION SYSTEM

[75] Inventors: Martin A. Hutchinson, Santa Clara; R. Howard Shaw, Palo Alto; George Coad, Lafayette, all of Calif.

[73] Assignee: Varian Associates, Inc., Palo Alto, Calif.

[21] Appl. No.: 611,551

[22] Filed: May 17, 1984

[51] Int. Cl.⁴ ............................................. C23C 15/00
[52] U.S. Cl. .............................. 204/298; 204/192 R; 414/217; 414/222; 118/729
[58] Field of Search .......................... 204/192 R, 298; 414/217, 222, 223; 118/729, 730

[56]  References Cited
U.S. PATENT DOCUMENTS

| | | | |
|---|---|---|---|
| 3,796,649 | 3/1974 | Lamont, Jr. et al. | 204/298 |
| 4,274,936 | 6/1981 | Love | 204/192 R |
| 4,311,427 | 1/1982 | Coad et al. | 414/217 |
| 4,416,759 | 11/1983 | Harra et al. | 204/298 |

Primary Examiner—Andrew H. Metz
Assistant Examiner—William Leader
Attorney, Agent, or Firm—Stanley Z. Cole; Kenneth L. Warsh

[57] ABSTRACT

The system for rotating the transfer plate of a coating system in a vacuum chamber consists of a transfer plate driver assembly on the outside of the chamber at the axis and a transfer plate rotator assembly inside the chamber. The driver assembly consists of a pneumatic actuator for linear motion, a barrel cam which translates the linear motion into rotary motion with high torque at starting and stopping positions, and a rotary feedthrough all in a structural housing. The rotator assembly comprises a central hub with means for supporting the end walls, a transfer plate hub assembly and a ratchet arm connected to the rotary feedthrough. As the pressure plate assembly is drawn back by the ram, it in turn draws back the transfer plate and engages the ratchet arm with the transfer plate hub. The actuator then rotates the transfer plate. The ram then reverses direction, the ratchet arm disengages and is returned to its initial position.

18 Claims, 9 Drawing Figures

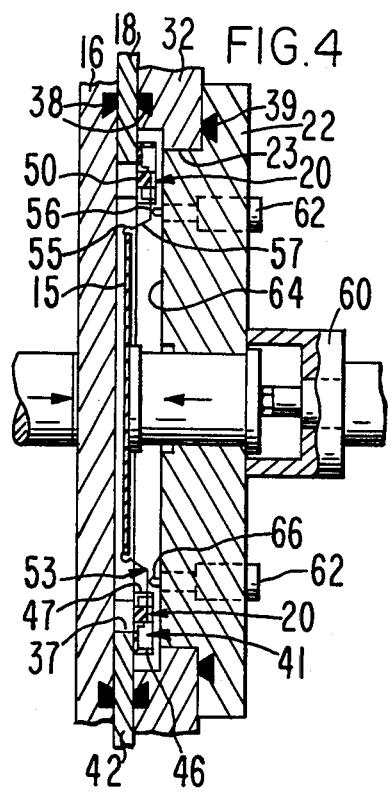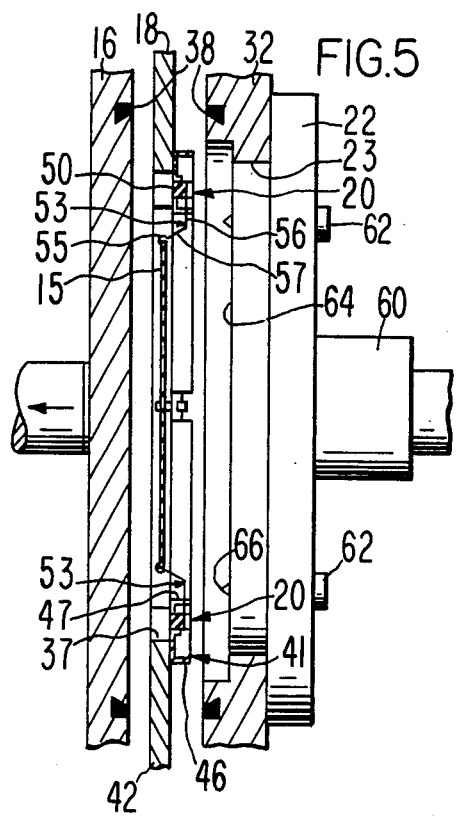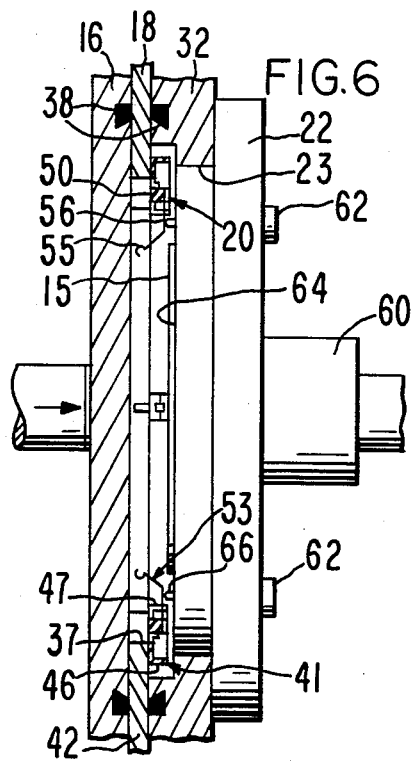

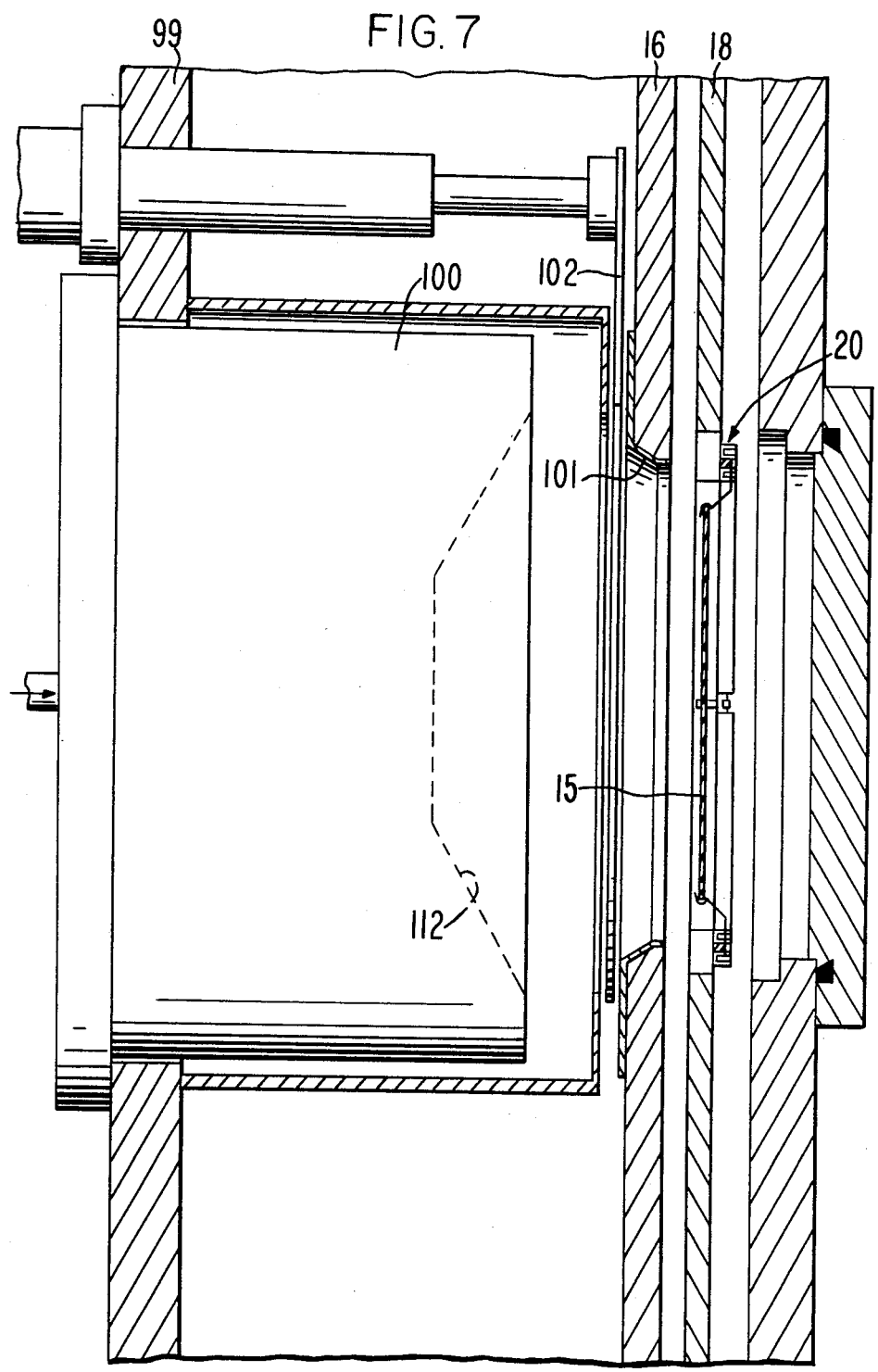

TRANSFER PLATE ROTATION SYSTEM

BACKGROUND OF THE INVENTION

The present invention relates to processing substrates in a vacuum chamber. More particularly, the field of the invention is sputter coating of semiconductor wafers, and apparatus for effecting such metallization coating of wafers individually, and on a serial, continuous basis. The invention is an improvement in the arrangement for rotating the transfer plate which carries the wafers from station to station within the sputtering apparatus.

In such a continuous system, a wafer is introduced through the load lock and mounted in a transfer plate. The load lock is then pumped and the transfer plate is then rotated to move the wafer to a work station. While processing of the wafer is being conducted at the work station, a finished wafer is being unloaded at the load lock and a new wafer loaded. There may be many similar or different work stations within the apparatus. In order to provide gas tight seals, it is necessary for the transfer plate and a pressure plate behind the transfer plate to move along the axis of rotation. To form a seal cooperating with suitably placed O-rings, the pressure plate forces the transfer plate against the front wall of the vacuum chamber. To permit rotation of the transfer plate, the pressure plate moves away from the transfer plate and the transfer plate moves away from the front wall. Thus, there are two types of motion within the apparatus. First, there is a rotation of the transfer plate through a precise angle. Second, there is a motion of the plates along the axis. The two motions must be coordinated.

In the prior art, the rotation is accomplished by a chain drive and hub system coupled to a motor. The chain drive is bulky and cumbersome. The rotational axis necessitates dynamic O-ring seals which can cause vacuum leakage problems. The axial motion is mechanically independent, but synchronized by the controlling computer.

The vacuum chamber of the wafer coating system is a large cylinder. The end walls are subject to considerable pressure which necessitates means for reinforcing the end walls. In the prior art, ribs were welded on these walls. The welding of the ribs causes problems of warping of the end walls.

OBJECT OF THE INVENTION

The object of the invention is to provide an improved transfer plate rotation system for use in coating systems which is rugged, compact, avoids dynamic O-ring seals, provides greater precision of rotation angle, strengthens the vacuum chamber and integrates the rotational and axial motions.

SUMMARY OF THE INVENTION

Preferred embodiments of the invention are described by way of example in connection with apparatus for coating wafers individually, which apparatus includes a ring-shaped sputtering source emitting coating material, means for locating an individual one of the wafers in facing stationary relationship to the source, as well as means for maintaining the source and wafer in an argon environment of up to 20 microns pressure (1 micron = $10^{-3}$ millimeters of mercury = 1 millitorr = 0.133 Pa) during coating of the wafer.

The coating apparatus includes internal wafer support means positioned within the chamber immediately inside of the entrance thereof, including means for releasably and resiliently gripping edgewise an individual wafer, to immediately accept a wafer upon insertion and permit instant release and removal upon completion of coating. The apparatus also includes load lock means including a movable closure member within the chamber to seal the wafer support means off from the remainder of the chamber interior and when the door of the entrance is opened, isolating the wafer and support means from the chamber environment during insertion and removal of a wafer.

The support means includes an internal wafer transfer plate which rotates around a central axis in order to move wafers from the load lock to work stations within the coating apparatus and back to the load lock. A pressure plate aids in sealing the transfer plate to the front wall of the vacuum chamber.

The system for rotating the transfer plate consists of a transfer plate driver assembly on the outside of the chamber at the axis and a transfer plate rotator assembly inside the chamber. The driver assembly consists of a pneumatic actuator for linear motion, a barrel cam which translates the linear motion into rotary motion with high torque at starting and stopping positions, and a rotary feedthrough all in a structural housing. The rotator assembly comprises a central hub with means for supporting the end walls, a transfer plate hub assembly and a ratchet arm connected to the rotary feedthrough. As the pressure plate assembly is drawn back by the ram, it in turn draws back the transfer plate and engages the ratchet arm with the transfer plate hub. The actuator then rotates the transfer plate. The ram then reverses direction, the ratchet arm disengages and is returned to its initial position.

BRIEF DESCRIPTION OF THE DRAWINGS

FIG. 4 is a cross-sectional elevational view of the door and load lock of FIGS. 1 through 3, showing the manner in which the door assembly loads a wafer into the load lock, and the manner in which the load lock is sealed from the remainder of the processing chamber interior;

FIG. 5 is a view similar to FIG. 4, showing the relative positions of the elements of the load lock upon completion of loading of the wafer in the transfer plate and evacuation for movement therewith;

FIG. 6 is a view similar to FIGS. 4 and 5, showing the position of the wafer and the load lock elements just subsequent to the extraction of a wafer from the internal wafer support assembly, and prior to the opening of the door, or just before the loading of a wafer into the internal wafer support assembly immediately after closure of the door for loading;

FIG. 7 is a sectional view of the coating station on an enlarged scale;

DETAILED DESCRIPTION

Figure 1:
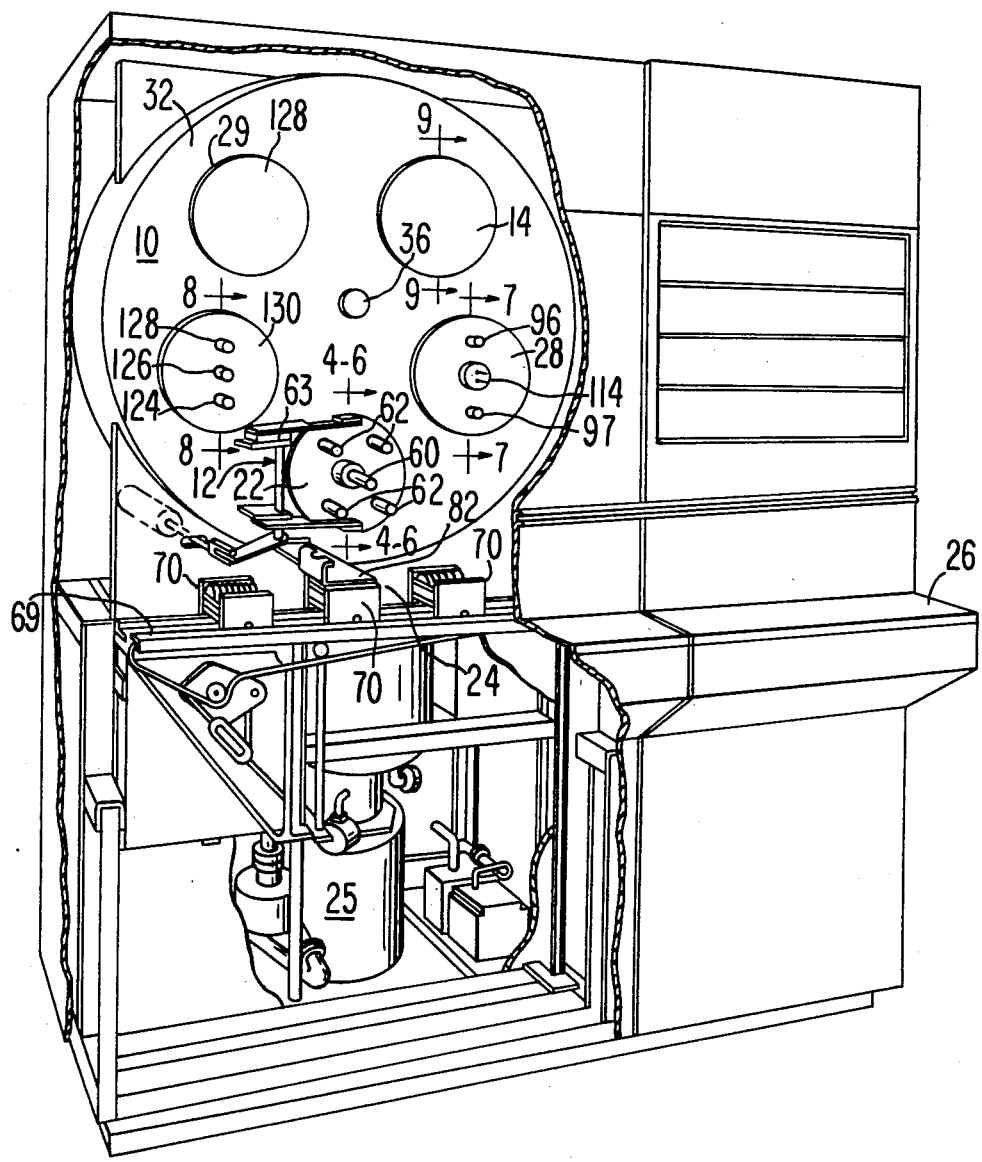
FIG. 1 is an elevational view of a complete wafer coating system in which the invention is particularly useful, showing the main cylindrical processing chamber, the door arrangement at the entrance of the load lock to the chamber, and the four remaining work stations of the processing chamber, together with portions of the wafer cassette load/unload assembly.

The wafer coating system of FIG. 1 principally includes a generally cylindrical vacuum processing chamber 10 having five work stations, one of which comprises load lock arrangement 12, and one of which comprises coating station 14. Remaining further elements of the coating system found within chamber 10 may be seen in more detail in FIG. 2, which also shows a wafer 15 within load lock 12, and also a wafer at coating station 14. Further elements include pressure plate 16, wafer transfer plate assembly 18, and clip assemblies 20 (better shown in FIG. 3), by which a wafer is retained within wafer transfer plate assembly 18. Door assembly 22, which seals the entrance opening 23 of chamber 10, and which cooperates with the just mentioned elements to form the chamber load lock arrangement 12, completes the principal elements of processing chamber 10. These elements, together with cassette load/unload assembly 24 and the various ancillary vacuum pumps 25 for chamber and load lock evacuation, and control means, are all housed compactly in cabinet 26.

The system desirably includes several other work stations other than load lock arrangement 12 and coating station 14, in particular wafer heating station 28, auxiliary station 29, and wafer cooling station 130. All five work stations are equally spaced laterally from each other and from the central axis 36 of the vacuum chamber. Also included are two pneumatic rams 30 and 31 which function to drive pressure plate 16 and wafer transfer plate assembly 18 against the front wall 32 of chamber 10, and transfer plate drive assembly 202 provides rotation of the transfer plate assembly about the central axis 36 of the vacuum processing chamber, as hereinafter described in detail in connection with FIGS. 8 and 9.

In general, wafers are individually presented and loaded by door assembly 22 into load lock arrangement 12 and thereby within wafer transfer plate 18. The wafer is then passed in turn to each of the work stations, where it is heated for completion of outgassing and/or sputter-etch cleaned, coated, optionally coated with a second layer, cooled, and then returned again to load lock 12 for removal from wafer transfer plate assembly 18, again by door assembly 22.

Now considering the system in more detail from the view point of an incoming wafer, the load lock arrangement 12 through which a wafer 15 must be passed in order to enter the evacuated environment of the chamber is of key importance. FIGS. 4–6 are especially important in appreciating the operation of the movable elements of load lock 12. As pointed out above, the load lock is defined by a sandwich arrangement of elements between the chamber door assembly in its closed position against the front wall of the processing chamber and the pressure plate in its driven position. The load lock is built around a circular aperture 37 within wafer transfer plate assembly 18, which is positioned internally of the chamber just inside the chamber entrance 23 associated with load lock 12, with plate assembly 18 generally parallel to wall 32 and the pressure plate 16, positioned within the chamber rearwardly of plate assembly 18. Wafer 15 is loaded and held within the load lock and within the plate assembly by means which will be described below. The controlled subatmospheric environment which may be provided within chamber 10 for certain wafer processing operations may be, for example, up to 20 microns of argon or other inert gas for sputter coating operations. Because of this evacuated environment, the load lock region must be sealed off from the remainder of the chamber interior whenever door 22 is open in order to preserve the evacuated environment. Pressure plate 16 serves the function of isolating the load lock area from the chamber interior (and also several other functions simultaneously at other work stations, as will be shown below). Pneumatic rams 30 and 31, mounted to the rear plate of the processing chamber, drive the pressure plate and plate assembly against front chamber wall 32, with pneumatic ram 30 being applied particularly to the pressure plate concentrically with load lock arrangement 12 to effect the sealing of the load lock. Both pressure plate 16 and chamber front wall 32 are equipped with O-rings 38 arranged in a circular pattern concentric with chamber entrance 23 provide vacuum seals in the sandwich arrangement of elements defining the load lock. Chamber door assembly 22, which in its closed position seals against the outside surface of chamber front wall 32 and also includes a concentric O-ring 39 to provide the vacuum seal, completes the load lock by sealing off the chamber entrance 23 from the outside temperature. FIGS. 4 and 6 show the completed load lock, with pressure plate 16 in its forward, advanced position, compressing plate assembly 18 against chamber wall 32, and sealing off aperture 37; and door 22 closed to seal off chamber entrance 23 to form the load lock about aperture 37, which is only of a size no larger than necessary to accommodate a single wafer. It may be seen that an unusually thin low-volume load lock is thereby defined with a minimum of elements, and of a minimum size necessary to accommodate wafer 15 therewithin. FIG. 5 shows pressure plate 16 in its withdrawn, rest position, and with the wafer already secured within plate assembly 18 within the chamber.

Figure 2:
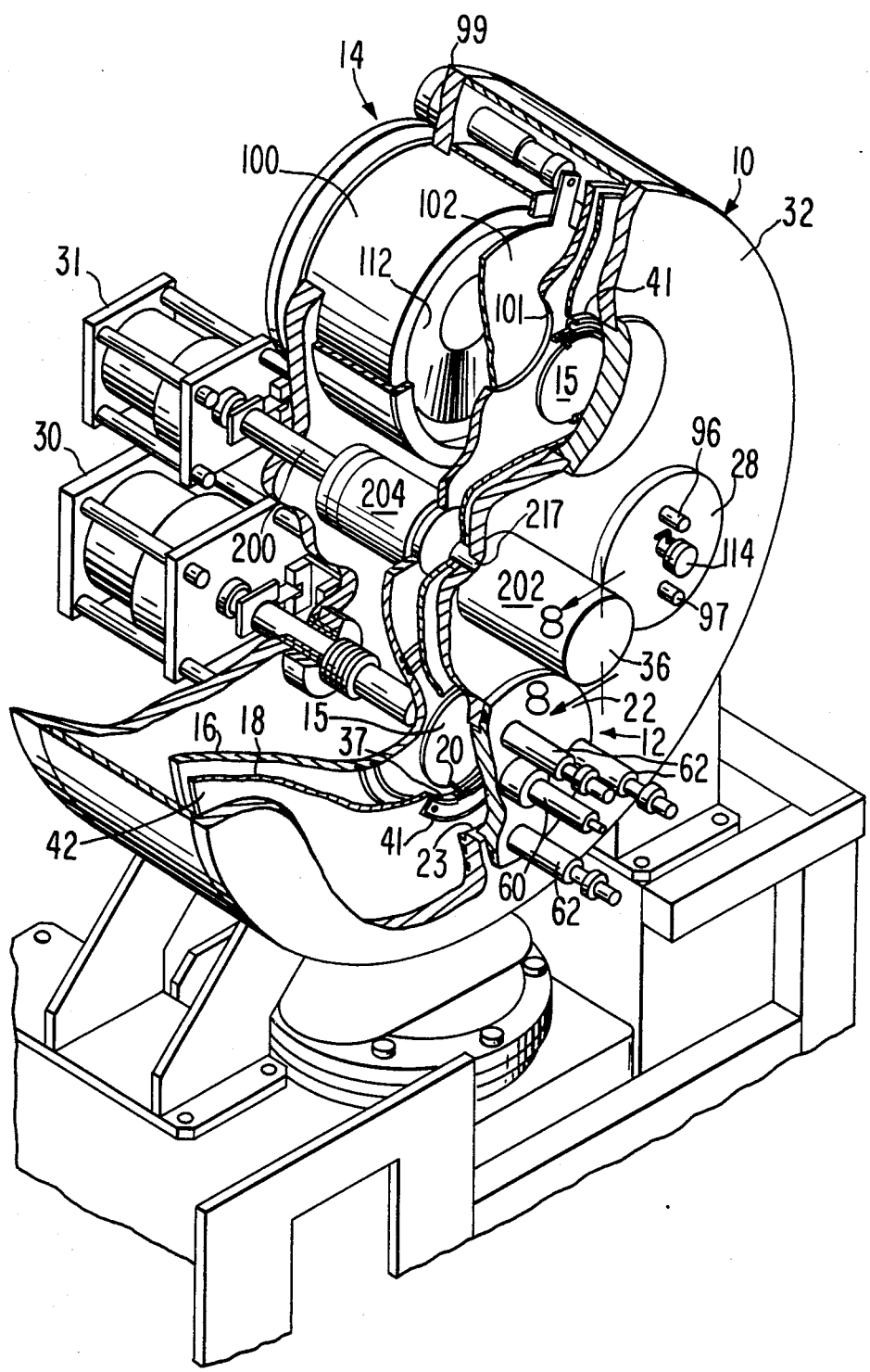
FIG. 2 is a broken-away perspective view of the processing chamber of FIG. 1, showing the load lock and sputter coating stations in more detail.

Cooperating with this thin load lock arrangement is wafer transfer plate assembly 18, which includes a plurality of circular apertures such as at 37 (as best seen in FIG. 2) matching the number and spacing of work stations within chamber 10. The apertures 37 are of a diameter larger than the wafers, are equally spaced from each other, and centered at the same radial distance from the central axis of the processing chamber. The aforementioned work stations are likewise spaced, so that when any aperture of the wafer transfer plate assembly 18 is aligned with any work station of the processing chamber, the remaining apertures are each similarly aligned with a respective one of the remaining work stations. Thus, if a wafer is secured within each of the apertures of transfer plate 18, each of such wafers can be individually processed at a work station simultaneously with the processing of other wafers respectively at the remaining work stations. In this manner, a wafer is individually processed at a given station, yet during the same time, several other wafers may also undergo other operations at the remaining work stations. In particular, while a wafer is being unloaded and/or loaded at load lock 12, another wafer may be coated at coating station 14, while still another wafer may be heated at heating station 28. The transfer plate driver assembly 202 intermittently operates to move plate assembly 18 by the distance of one station so as to serially present each of the wafers in turn to each of the processing stations in a counterclockwise direction, until a given wafer finally returns to the load lock for unloading therefrom. The details of the transfer plate rotation assembly 204 are not shown in FIG. 2 but are discussed hereinafter in connection with FIGS. 8 and 9.

As the wafer is transported from work station to work station as above described, it is important that the wafer be supported within transfer plate assembly 18 so as to avoid any risk of mechanical damage and abrasion due to being moved about, and generally so as to be protected from mechanical shock, vibration, and abrasion. To this end, wafer carrier aperture 37 is of a diameter such that both a wafer and a set of clip assemblies 20 can be accommodated within the periphery of the aperture, and recessed and parallel with the transfer plate, thereby protecting the wafer. The set of thin edgewise-acting clip assemblies also is important to the formation of the thin load lock arrangement 12, and edgewise resiliently supports the wafer in an upright position within plate assembly 18. An especially advantageous form of such an edgewise acting clip assembly is shown in cross section in FIGS. 4 through 6. A set of four clip assemblies 20 is mounted within retaining rings 41 which are removably attached to the disc-like circular wafer transfer plate 42 concentrically with each of plate apertures 37, thus forming the complete wafer transfer plate assembly 18. This arrangement mounts a set of clip assemblies 20 in spaced relationship within the periphery of each circular aperture 37. Retaining rings 41 are of U-shaped cross section, with each having flanges 46 and 47 defining the inner and outer peripheries thereof, and clip assemblies 20 are recessed within these flanges.

As may be seen in any of the FIGS. 3 through 6, clip assemblies 20 each include a block 50 of generally rectangular cross section, which may be of insulating material for applications such as sputter etch for which electrical isolation of the wafer is desired, and an elongated spring clip 53 firmly engaged in wraparound fashion about block 50. Each clip 53 includes at the end thereof opposite the block an arcuate finger portion or tip 55, which is of a curvature in radius appropriate to gripping an edge of a wafer. Extending from block 50 is proximal flat portion 56, which lies within a plane closely adjacent and parallel with the plane defined by plate aperture 37. On the other hand, distal portion 57 is angled away from portion 56 down toward the plane of plate aperture 37, and defines an obtuse angle with portion 56. This clip arrangement results in a plurality of arcuate tips 55 lying on a circular pattern of diameter somewhat less than that of a typical wafer 15 (such circular pattern also lies within the plane of wafer transfer plate 42).

Wafer insertion into load lock 12 may be effected manually by simply pushing a wafer by its edge or rear face into clip assemblies 20. This will, however, involve some edge rubbing of the wafer against distal portion 56, to spread apart the clips somewhat to accept the wafer within tips 55. In order to insert a wafer without such rubbing contact therewith, the clips must first be slightly spread, and then allowed to rebound against the edge of the wafer upon insertion thereof into the load lock. Although both wafer insertion and clip spreading may be done manually, it is far preferable to avoid all such manual operations, and the consequent added risk of damage, error, and contamination associated therewith. Chamber door assembly 22 carries thereon a vacuum chuck 60 centrally axially therethrough, and a plurality of clip actuating means 62 near the periphery thereof. These elements, along the wafer cassette load-/unload assembly 24, provide an automated wafer loading and unloading arrangement for load lock 12 which avoids all such manual handling of the wafers, and automates the loading process.

Figure 3:
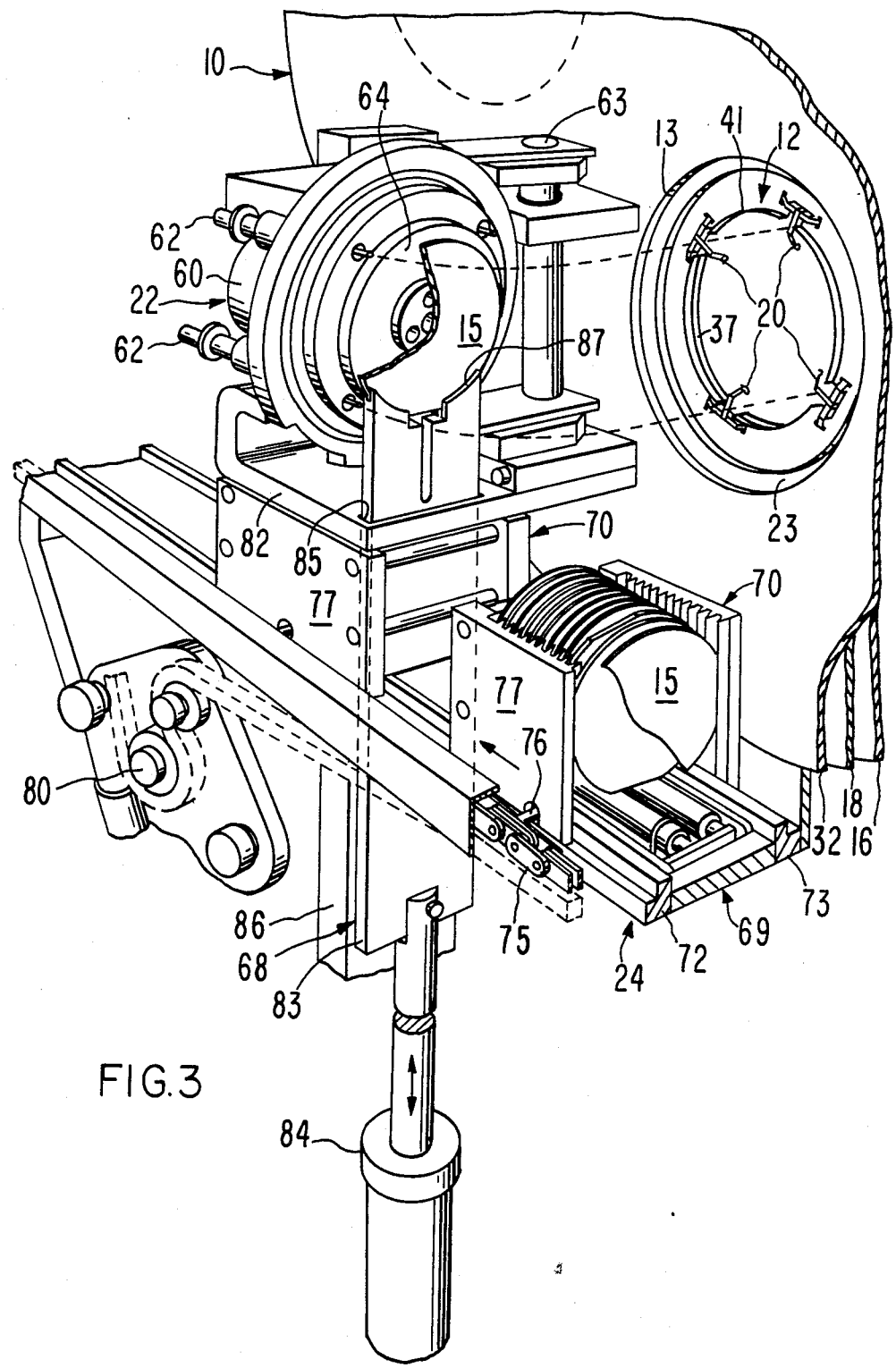
FIG. 3 is a perspective view of the cassette load/unload assembly of FIG. 1, showing its manner of cooperation with cassettes of vertically-oriented wafers and the door assembly of the processing chamber, and the manner in which wafers are transferred therebetween and into the chamber load lock.

As thus seen in FIGS. 1 and 3, chamber door assembly 22 is attached to front wall 32 of chamber 10 by a heavy-duty hinge 63 having a vertical axis, to allow the door to open and close in a conventional manner to a fully open position as shown, wherein the door and its inside face 64 are vertical and perpendicular to the plane of chamber entrance 23, as well as to plate assembly 18. Vacuum chuck 60, which extends axially and centrally through the door so that the active end thereof forms part of the inside face 64 of the door, engages a wafer presented vertically to the inside face of the door and holds the wafer by vacuum suction as the door is closed, whereupon the vacuum chuck axially extends from the inner door face as shown in FIG. 4 to carry the wafer into engagement with clip assemblies 20. The vacuum chuck will then withdraw, and wafer 15 is held in the chamber by the clip assemblies and undergoes processing, and movement to the various work stations in turn by rotation of plate assembly 18. In this preferred embodiment, the vertical presentation of the wafer to the inside face 64 of the door is effected by load/unload assembly 24, as will be further detailed below.

It should be noted that the load lock arrangement, wafer transfer plate assembly 18, and door assembly 22 need not be limited to a vertical orientation, although this is preferred to help obviate any possibility of debris settling upon a surface of the wafer or sputter target. The clip assembly, transfer plate and load lock arrangement of the invention, as well as all of the work stations, function equally well if oriented horizontally. Indeed, although the load/unload assembly 24 for the vertically-oriented wafer cassettes is meant for vertical operation, the door assembly 22 could easily be made to load wafers into the load lock in a horizontal plane, yet accept wafers in a vertical orientation, by suitable modification of its manner of mounting to the chamber wall in a conventional manner.

As noted above, it is preferable to avoid simply loading a wafer into the clip assemblies 20 within the load lock by pushing a wafer against the angled distal portion 57 of the clips. In order to insert a wafer without such rubbing contact, the clips must first be slightly spread, and then allowed to rebound against the edge of the wafer upon insertion thereof into the load lock. This is accomplished automatically as the wafer is being inserted by vacuum chuck 60 by four clip actuating means 62 mounted within the door as aforementioned. Each clip actuating means 62 is mounted so as to be in registration with a corresponding one of clip assemblies 20 when the door is in its closed position. Each clip actuating means 62, shown in detail in FIG. 4, includes a pneumatic cylinder 65, a contact pin 66 which moves axially inwardly and outwardly, and is propelled by cylinder 65. Pins 66 are each in registration with one of flat proximal clip portions 56 when the door is in its closed position. With door 22 closed, pins 66 are extended just prior to insertion of a wafer, or as a wafer is to be withdrawn. The pressure of a pin 66 against the facing flat clip proximal portion 56 presses the clip and causes the tip 55 to swing back and outwardly, thereby releasing the clips, to facilitate insertion or removal of a wafer without rubbing contact therewith.

During wafer unloading after completion of the wafer processing, these operations are reversed, with the chuck again extending and applying vacuum to the backside of the wafer to engage same, with the clip actuating means again cooperating to release the clips, whereupon the door opens and the chuck retains the wafer on the inside face of the door by vacuum suction until the wafer is off-loaded by load/unload assembly 24.

As we have seen, when in its fully opened position, door assembly 22 is poised to accept a wafer for insertion into the load lock arrangement 12, or it has just opened and carried a finished wafer from load lock 12, which must then be unloaded from the vacuum chuck. The function of presenting a wafer to the door assembly 22 for loading, or for removing a processed wafer therefrom for unloading, is performed by cassette load/unload assembly 24, which includes wafer elevator assembly 68 and wafer cassette conveyor assembly 69. Extending below and on either side of chamber entrance 23 and attached to wall 32 of the chamber is the conveyor assembly, which moves cassettes 70 of wafers generally along from the right of the entrance as shown in FIG. 1 to left. The cooperating wafer elevator assembly 68 lifts wafers individually from the cassettes conveyed by conveyor assembly 69 to the operative end of vacuum chuck 60 within the inside face 64 of door assembly 22, or lowers such wafers from the door upon completion of processing.

Conveyor assembly 69 includes a spaced pair of parallel rails 72 and 73 extending horizontally and longitudinally across the front of wafer processing chamber 10. The rails support and convey cassettes 70, and the spacing of rails 72 and 73 is such that the sidewalls of the cassettes straddle the rail and enable the cassettes to be slidably moved along the rails across the conveyor assembly. Motive power for the movement of the cassettes is provided by chain drive means 75 which includes various guides and gear arrangements causing a roller chain to be moved alongside rail 72. The chain is provided at regular intervals with guide pins 76, which engage a matching cutout on the bottom of cassette wall 77 adjacent rail 72. Thus, the cassette is caused to move at the same rate as the chain toward and away from elevator assembly 68, as required. A stepper motor means 80 is provided as the driving power for the chain means 75, to provide precise control over the movement of the cassettes, so that any chosen individual wafer within a cassette may be positioned for interaction with the wafer elevator assembly 68.

The cassettes 70 hold a plurality of the wafers 15 in spaced, facing, aligned and parallel relationship, and are open at the top as well as over a substantial portion of their bottom, to permit access from below and above the wafers. They must be loaded so tat the front faces of the wafers, which contain the grooves, steps, and other features defining the microcircuit components, face away from the inside face 64 of the open door 22, and so that the rear faces of the wafers face toward the door assembly. This ensures that when the vacuum chuck 60 engages the wafer, no contact is made with the front face containing the delicate microcircuits, and that the wafer is properly positioned upon insertion into the load lock 12 so that it will be oriented properly with respect to processing equipment within the processing chamber 10.

The wafer elevator assembly 68 is positioned below and just to the left side of chamber entrance 23 and includes an upper guide plate 82, a blade-like elevator member 83, and an actuating cylinder 84 connecting to the lower end of member 83. Elevator blade member 83 is guided for movement up and down in a vertical path intersecting at right angles conveyor 69 between rails 72 and 73 to inside face 64 of door 22. Guide slot 85 in guide plate 82 just below the inside face of the door in the open position provides the uppermost guide for blade 83, while a vertical guide member 86 extending below the conveyor toward the actuating cylinder also aids in retaining blade 83 on its vertical path. The width of blade 83 is less than that of the spacing between rails 72 and 73, and also less than the spacing between the main walls of the cassettes 70 which straddle rails 72 and 73. Blade 83 is also thinner than the spacing between adjacent wafers retained in cassettes 70.

Blade member 83 is further provided with an arcuate upper end 87 shaped to match the curvature of the wafers, and a groove within this end adapted to match the thickness of a wafer and retain a wafer edgewise therewithin. Thus, elevator blade member 83 passes between guide rails 72 and 73 and intersects conveyor and cassette at right angles thereto, upon stepper motor means 80 and chain drive 75 bringing a cassette and wafer into registration over the path of the blade. As may be seen, the cassettes are constructed to allow access from below to the wafers, and to allow elevator blade 83 to pass completely therethrough. Accordingly, upon stepper motor means 80 and chain means 75 placing a cassette and wafer in registration over the path of the blade, blade 83 moves upwardly between the conveyor rails to engage from below a wafer within the groove of its upper end 87, and elevate the wafer upwardly to a position in registration concentrically with and immediately adjacent inside face 64 of chamber door 22 in its open position. Note that since the wafers are vertically oriented, gravity aids in holding the wafers firmly yet gently and securely in the grooved end 87 of the blade.

Upon arrival of the wafer at the door 22, vacuum chuck 60 engages wafer 15 at its rear face by suction, and elevator blade 83 then is lowered through guide slot 85 and the cassette to a point below conveyor 69. Door 22 then closes with the wafer retained by the chuck 60, and the wafer is thereby loaded into the load lock arrangement 12 and chamber entrance 23 sealed simultaneously as described above for processing within chamber 10. Prior to completion of processing for wafer 15, still further wafers may be loaded within the remaining ones of apertures 37 of plate assembly 18; therefore the stepper motor and chain drive step the cassette one wafer position to move the next wafer serially in position over blade 83. Blade 83 then rises to repeat its operation of moving this next wafer upwardly to the open door, whose vacuum chuck then again engages that wafer for insertion into the load lock. Meanwhile, upon completion of processing for original wafer 15 by rotation in turn to each station, it is again at load lock 12, and vacuum chuck 60 again extends to the backside of the wafer while the door is still in its closed position, and clip actuating means 62 simultaneously depress the clips to disengage same from the wafer to enable the removal thereof by chuck 60, whereupon the door is opened and the wafer again positioned over the path of blade 83. Meanwhile, stepper motor means 80 and chain means 75 move the cassette back so that the original position of wafer 15 is presented over the blade path. Blade 83 then rises through conveyor rails 72 and 73 and slot 85 upwardly to engage the lower edge of wafer 15, whereupon chuck 60 releases the wafer, and enables blade 83 to lower the wafer back into its original position within the cassette. The cassette is then propelled forward to the position of the next wafer to be processed serially.

As aforementioned, pressure plate 16 is driven against transfer plate 18 and wall 32 whenever door 22 is in its opened position, to protect the evacuated interior environment of the chamber from the atmosphere. We have seen that FIGS. 4 and 5 show in more detail the relative positioning of the pressure plate and wafer trasnfer plate, with FIG. 4 showing the aforementioned sandwich arrangement of the elements defining the load lock arrangement 12, and FIG. 5 showing the relative positioning of the elements when the pressure plate is in its withdrawn position. Note also that FIG. 4 shows vacuum chuck 60 in its extended position as the wafer is inserted into clip assemblies 20 with pins 67 of clip actuating means 62 partially extended after having spread the clips; while in FIG. 5, the vacuum chuck has withdrawn, as have the pins of the clip actuating means, and the wafer is now securely mounted in wafer transfer plate assembly 18. With pressure plate 16 withdrawn, the wafer is now ready to be rotated to subsequent processing stations. In FIG. 6, the vacuum chuck is also in the withdrawn position; however, the vacuum suction is operative, and the wafer is shown in its position against the inner face 64 of chamber door 22. This is, of course, the position of the elements of the load lock and the wafer just after the wafer has been withdrawn from clip assemblies 20, prior to its being removed from the load lock; or, it also represents the position of the elements just after the door has been closed and the vacuum chuck has not yet advanced the wafer to its position within aperture 51 of the wafer carrier assembly. Pins 67 of the clip actuating means 62 are shown bearing upon the clips just prior to depressing same to spread the clips in order to accept the wafer therewithin.

Upon completion of loading of the load lock with a wafer 15, the load lock chamber is pumped down to a level compatable with the processing chamber environment before the pressure plate is withdrawn as shown in FIG. 5, and the wafer 15 rotated to the first work station.

While a wafer is being loaded into and/or unloaded from load lock station 12, pressure plate 16 is in its active advanced position of FIG. 4, whereby plate assembly 18 is forced against front wall 32 of the chamber, the pressure plate is similarly urging wafers in the remaining stations into contact or closer, working cooperation with the processing devices at those stations; for example, the first or heating station 28.

The next station (see FIGS. 1 and 9) to which the wafer is advanced is coating station 14, where a sputter coating source 100 is mounted on the back plate 99 of the chamber, and for which an aperture 101 of circular form is made within the pressure plate, to enable the sputtering source to direct coating therethrough to a wafer advanced by transfer plate assembly 18 into registration at the coating station. A shutter 102 is also provided to enable the coating material to be blocked during rotation of the transfer plate assembly and when a wafer is not present at the coating station.

Referring once again to FIG. 1, the next station to which the wafer 15 is advanced is a second coating station 128. After leaving station 128, the wafer proceeds to station 130 which may be a cooling station.

The final station to which wafer 15 is advanced is the load lock station 12, from which the wafer is removed and returned by means of load/unload assembly 24 to the same slot in the cassette 70 from which it originally came. The entire load/unload operation was described in detail earlier.

In the embodiment of the apparatus of this invention, the wafer 15 is presented vertically to the inside face of chamber door 22, where it is engaged by vacuum chuck 60. Vacuum chuck 60 and clip actuating means 62 are mounted within the chamber door 22. Chamber door 22 is the outer door of load lock arrangement 12.

In some applications it may be desirable to separate the wafer loading/unloading means from the vacuum sealing means. Accordingly, a further embodiment is one in which the wafer loading/unloading means retracts after loading the wafer into wafer transfer plate assembly 18, following which a separate O-ring-sealed door is brought into position to effect the outer seal for the load lock.

Figure 8:
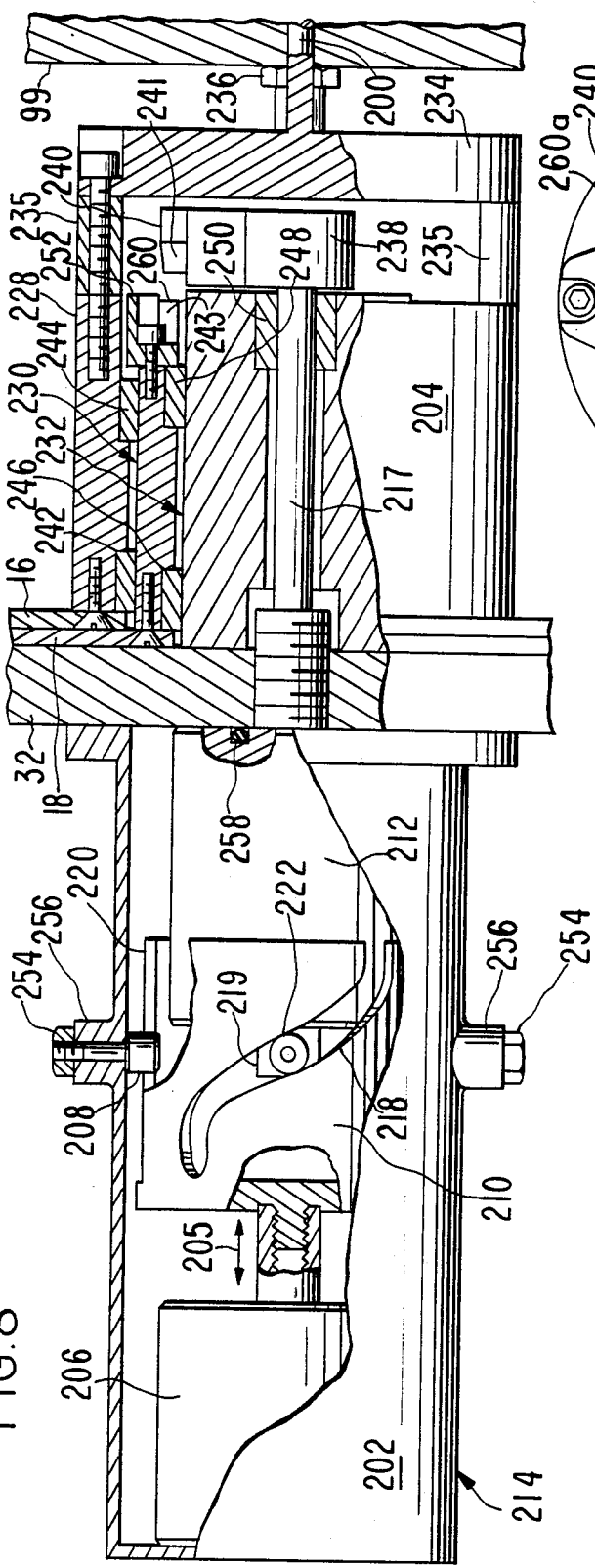
FIG. 8 is a partial sectional view on lines 8—8 on FIG. 2 and shows transfer plate rotation system of this invention.
Figure 9:
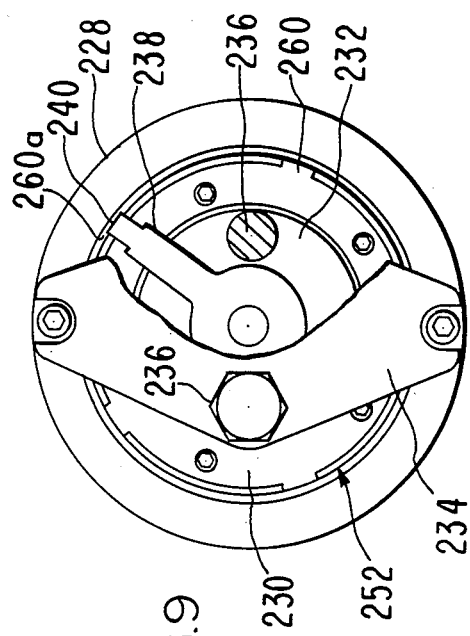
FIG. 9 is an end view of the transfer plate rotation system.

The transfer plate rotation system is shown in FIGS. 8 and 9. The front wall plate 32 of the chamber separates the transfer plate driver assembly 202 from the transfer plate rotation assembly 204. A pneumatic or electromechanical activator 206 drives a barrel cam 210 axially along the direction of arrow line 205 by means of shaft 207. The barrel cam 210 is supported by two cam rollers 208 in straight slots 220 formed into opposite sides of the barrel. Each cam roller 208 is mounted through a boss 256 and fastened with a nut 254. Two sine slots 218 are formed on opposite sides of the barrel cam 210. Cam rollers 222 riding in the sine slots 218 are attached to the center drive shaft 219 of a rotary feedthrough 212 such as those sold by the Ferrofluidic Corp. of Burlington, Mass. and shown in U.S. Pat. No. 3,620,584 to Rosensweig, the disclosures of which are hereby incorporated by reference. Axial movement of shaft 207 causes axial movement of cam 210 and thus rotational movement of feedthrough shaft 217. The sine slots 218 are cut in a sinusoidal shape so as to develop maximum torque at the beginning and end of each movement. The rotary feedthrough 212 is threaded into the front plate 32 and sealed with the O-ring 258. The transfer plate driver assembly is in a structural housing 214.

Within the transfer plate rotation assembly 204, the central hub 232 remains fixed and is attached to the front wall plate 32. The two support bolts 236 are used to support the back plate under vacuum pressure. A first bushing 250 is made of a polyimide material such as "VESPEL ®", sold by E. I. Dupont de Nemours and Company. First bushing 250 supports the shaft and ratchet arm 238 having ratchet tip 240. The ratchet tip 240, can have a V-shaped tip 241 and the transfer index plate socket 252 can be formed to have a V-shaped groove 243 to engage the tip. The transfer plate assembly 18 is attached to the transfer plate hub assembly 230. The pressure plate 16 is attached to the pressure plate hub assembly 228. Between the central hub 232 and the transfer plate hub assembly 230, there are second bushing 246 and third bushing 248. Between the transfer plate hub assembly 230 and the pressure plate hub assembly 228 there are fourth bushing 242 and fifth bushing 244. All bushings are made of the same material. A yoke 234 is bolted with spacing tubes 235 to the pressure plate hub assembly 228. The yoke 234 is fastened to the shaft 200 of a single pneumatic ram 31. Oversize holes are formed in yoke 234 on its opposite edges to permit free passage of two bolts 236 which are threaded into central hub 232. Bolts 236 are screwed outwardly to contact rear wall 99. In this way atmospheric pressure on the outside of the large flat walls 32 and 99 is prevented from bowing the walls inward when the inside of the chamber is under vacuum. A transfer plate index socket 252 of hardened steel is fastened to the end of the transfer plate hub assembly 230.

As the pneumatic ram 31 draws shaft 200 toward the back of the chamber, the yoke 234 is drawn back which in turn draws back the pressure plate hub assembly 228 and the pressure plate 16. As the movement continues, the fifth bushing 244 contacts the transfer plate index socket 252 which in turn draws back the transfer plate hub assembly 230 and the transfer plate 18. As the transfer plate index socket 252 moves back one of five recesses 260 therein engages the ratchet tip 240. At this point in the motion pressure plate 16 and transfer plate 18 will be positioned as shown in FIG. 5. Now the transfer plate driver assembly 202 is used to apply torque via the actuator 206, the barrel cam 210, the rotary feedthrough 212, and the shaft 217 to the ratchet arm 238 which rotates by the appropriate angle. For the five work station embodiment shown here, the appropriate angle would be 72 degrees. The ram shaft 200 is now forced toward the front of the chamber locking the pressure plate 16 and transfer plate assembly 18 in place to form the load lock seal as shown in FIGS. 4 and 6. After this positioning is reached the transfer plate driver assembly 202 is reversed, returning the ratchet arm 238 to its original position. The motion of the ratchet arm 238 is only back and forth through 72 degrees (for a five station system) so arm 238 does not contact bolts 236 or spacing collars 235. For example, the motion of arm 238 is between the position of recesses 260a and 260b as shown in FIG. 9.

This invention is not limited to the preferred embodiment and alternatives heretofore described, to which variations and improvements may be made, without leaving the scope of protection of the present patent, the characteristics of which are summarized in the following claims.

What is claimed is:

1. An apparatus for rotating a transfer plate inside a cylindrical vacuum chamber having front and back end walls and for translating a pressure plate, comprising:
    a central hub attached to the inside of a front end wall of a vacuum chamber;
    support means attached to said central hub whereby to support a back end wall of said vacuum chamber;
    a transfer plate hub assembly attached to a transfer plate, said transfer plate hub assembly being formed around said central hub;
    a pressure plate hub assembly attached to a pressure plate, said pressure plate hub assembly being formed around said transfer plate hub assembly;
    a yoke attached to said pressure plate hub assembly and to a ram means for moving said yoke;
    an actuating means;
    a means for translating linear motion of said actuating means into rotary motion;
    a rotary vacuum sealing feedthrough means having an axle which axle has a first end adapted to receive rotary motion from said means for translating linear motion into rotary motion;
    a ratchet arm attached at a first end to a second end of said axle of said rotary vacuum sealing feedthrough means;
    a ratchet tip attached to a second end of said ratchet arm; and
    a transfer plate index socket attached to said transfer plate hub assembly and formed to engage said ratchet tip.

2. An apparatus as claimed in claim 1 where said actuating means is a pneumatic actuator.

3. An apparatus as in claim 1 where said actuating means is an electromechanical actuator.

4. An apparatus as in claim 1 where said means for translating linear motion into rotary motion is a barrel cam.

5. An apparatus as in claim 4 where said actuating means, said barrel cam and said rotary feedthrough are contained in a structural housing.

6. An apparatus as in claim 1 where said rotary feedthrough is a modular magnetic fluid seal incorporating magnetic sealing fluid.

7. An apparatus as in claim 1 where said central hub, transfer plate hub and pressure plate hub are formed as concentric cylindrical shells.

8. An apparatus as in claim 1 where said support means is a pair of bolts threaded into said central hub at the end of said central hub nearest the back end wall of the chamber, the bolts being adjusted so that the bolt heads contact and support the back end wall when vacuum is drawn.

9. An apparatus as in claim 1 where a first bushing is between said axle and said central hub.

10. An apparatus as in claim 9 where second and third bushings are between said central hub and said transfer plate hub.

11. An apparatus as in claim 10 where fourth and fifth bushings are between said transfer plate assembly and said pressure plate hub assembly.

12. An apparatus as in claim 11 where said fifth bushing is positioned to engage said transfer plate index socket as the pressure plate is drawn toward the back end plate of the vacuum chamber.

13. An apparatus as in claim 1 where said ratchet tip has a v-shaped tip and said transfer index socket is formed to engage said tip.

14. An apparatus as in claim 4 where said barrel cam is constructed and adapted to transmit high torque at the beginning and end of each stroke.

15. An apparatus as in claims 9, 10 or 11 where said bushings are made of polyimide.

16. An apparatus for rotating a transfer plate inside a cylindrical vacuum chamber having front and back walls and for translating a pressure plate, comprising:
    a central cylindrical hub attached to an inside of a front wall of a vacuum chamber;
    a pair of bolts having heads, said bolts being threaded into said central hub at an end of said central hub nearest the back end wall of the vacuum chamber, said bolts being adjusted so that said bolt heads contact and support the back end wall when vacuum is drawn;
    a transfer plate hub assembly attached to a transfer plate, said transfer plate hub assembly being formed around said central hub as a cylindrical shell;

a pressure plate hub assembly attached to a pressure plate, said pressure plate hub assembly being formed as a cylindrical shell around said transfer plate hub assembly;

a yoke attached to said pressure plate hub assembly and to a ram means for moving said yoke;

a pneumatic actuator;

a barrel cam means for translating linear motion from said actuating means into rotary motion such that the torque output of said barrel cam is high at the beginning and end of each stroke;

a rotary vacuum sealing feedthrough of the modular magnetic fluid seal type incorporating magnetic sealing fluid, said feed-through having an axle the first end of which receives rotary motion from said barrel cam;

a structural housing for said pneumatic actuator, said barrel cam and said rotary feedthrough;

a first bushing between said axial and said central hub;

a second and third bushing between said central hub and said transfer plate hub assembly;

a fourth and fifth bushing between said transfer plate hub assembly and said pressure plate hub assembly;

a ratchet arm attached at a first end to a second end of said axle of said rotary feedthrough;

a ratchet tip attached to a second end of said ratchet arm; and a transfer plate index socket attached to said transfer plate hub assembly nearest to the back end wall of said vacuum chamber, said socket being formed to receive said ratchet tip.

17. Apparatus for processing workpieces, said apparatus comprising:

a vacuum chamber including a workpiece-loading wall, an opening in said loading wall for receiving workpieces, and door means for closing said opening;

said vacuum chamber further including a second wall spaced opposite said loading wall;

workpiece-transfer means in said chamber and adapted to carry a plurality of workpieces in spaced circular arrangement;

processing means for processing workpieces carried on said transfer means;

central hub means inside said chamber and having one end thereof abutting said loading wall, said central hub means being positioned about an axis offset from said opening;

means rotatably supporting said transfer means coaxially with said hub means;

rotary drive means passing through said central hub means and having a radial extension thereon for rotating said transfer means around said axis, said drive means being adapted to oscillate through an arc of substantially less than 360 degrees; and support means extending between and in contact with the other end of said hub means and second wall, whereby inward bowing of said walls is resisted by said support means and said hub means when the inside of said chamber is below atmospheric pressure, said support means being positioned with respect to said radial extension such that the support means would prevent 360 degrees rotation of the radial extension, but permit said arcuate oscillation.

18. Apparatus for processing workpieces, said apparatus comprising:

a vacuum chamber including a workpiece-loading wall, an opening in said loading wall for receiving workpieces, and door means for closing said opening;

said vacuum chamber further including a second wall spaced opposite said loading wall;

workpiece-transfer means in said chamber and adapted to carry a plurality of workpieces in spaced circular arrangement;

pressure plate means in said chamber adjacent said transfer means and on the side of said transfer means opposite said loading wall;

processing means for processing workpieces carried on said transfer means;

support means inside said chamber and supporting said transfer means for rotation about an axis offset from said opening;

means for rotating said transfer means around said axis;

ram means connected to said pressure plate means and adapted to move said pressure plate means toward and away from said loading wall;

said transfer means being in contact with said pressure plate means when said pressure plate means is moved fully toward said loading wall;

first abutment means moveable with said pressure plate means as the pressure plate means is moved toward and away from said loading wall by said ram means, second abutment means associated with said transfer means and positioned for contact by said first abutment means when said pressure plate means is moved away from said loading wall; and said first and second abutment means being spaced apart when said pressure plate means is moved fully toward said loading wall; whereby when said ram means is moved fully toward said loading wall, said transfer means is in contact with said pressure plate means, and when said ram means is moved away from said loading wall said pressure plate means is first moved away from said loading wall to provide a spacing between said pressure plate means and said transfer means, and then continued movement of said pressure plate means moves said transfer means away from said loading wall by contact between said first and second abutment means.

* * * * *